(12) United States Patent
Kondo et al.

(10) Patent No.: US 9,991,051 B2
(45) Date of Patent: Jun. 5, 2018

(54) BODY WITH MAGNETIC FILM ATTACHED AND MANUFACTURING METHOD THEREOF

(71) Applicant: TOKIN CORPORATION, Sendai-shi, Miyagi (JP)

(72) Inventors: Koichi Kondo, Sendai (JP); Hiroshi Ono, Sendai (JP); Yukihiro Numata, Sendai (JP)

(73) Assignee: TOKIN CORPORATION, Miyagi (JP)

( * ) Notice: Subject to any disclaimer, the term of this patent is extended or adjusted under 35 U.S.C. 154(b) by 384 days.

(21) Appl. No.: 14/704,530

(22) Filed: May 5, 2015

(65) Prior Publication Data
US 2015/0235764 A1 Aug. 20, 2015

Related U.S. Application Data

(62) Division of application No. 13/128,759, filed as application No. PCT/JP2009/003591 on Jul. 29, 2009, now abandoned.

(30) Foreign Application Priority Data

Nov. 12, 2008 (JP) .................................. 2008-289493

(51) Int. Cl.
*H01F 41/24* (2006.01)
(52) U.S. Cl.
CPC .................................... *H01F 41/24* (2013.01)
(58) Field of Classification Search
None
See application file for complete search history.

(56) References Cited

U.S. PATENT DOCUMENTS

| 4,477,319 A | 10/1984 | Abe et al. |
| 2002/0155710 A1 | 10/2002 | Okamura et al. |

(Continued)

FOREIGN PATENT DOCUMENTS

| JP | 59111929 A | 6/1984 |
| JP | 60140713 A | 7/1985 |
| JP | 6130674 A | 2/1986 |

(Continued)

OTHER PUBLICATIONS

Material Property Database for Polyimide <http://www.mit.edu/~6.777/matprops/polyimide.htm>accessed Jun. 18, 2017.*

(Continued)

*Primary Examiner* — Mandy C Louie
(74) *Attorney, Agent, or Firm* — Holtz, Holtz & Volek PC

(57) ABSTRACT

A fabrication method for fabricating a magnetic film provided body includes preparing a base body and forming a magnetic film on the base body. The magnetic film includes organic film(s) and ferrite film(s) alternately layered. The formation of the magnetic film alternately includes forming a ferrite film through a ferrite plating method, the ferrite film having a thickness of 20 μm or less and forming an organic film having a thickness of 0.1 μm to 20 μm, both inclusive, and a ratio t/E of 0.025 μm/GPa or more, where "t" indicates the thickness of the organic film while "E" indicates Young's modulus of the organic film.

12 Claims, 3 Drawing Sheets

(56) References Cited

U.S. PATENT DOCUMENTS

2004/0219328 A1* 11/2004 Tasaki .................... C22C 30/00
428/692.1
2007/0231614 A1   10/2007 Kondo et al.

FOREIGN PATENT DOCUMENTS

| JP | 1122929 A | 5/1989 | | |
|---|---|---|---|---|
| JP | 2116631 A | 5/1990 | | |
| JP | 2248328 A | 10/1990 | | |
| JP | H02248329 | * 10/1990 | ............ | H01F 10/20 |
| JP | 456107 A | 2/1992 | | |
| JP | 2001273626 A | 10/2001 | | |
| JP | 2004260020 A | 9/2004 | | |
| JP | 2005019566 A | 1/2005 | | |
| JP | 2005032970 A | 2/2005 | | |
| JP | 2005191098 A | 7/2005 | | |
| JP | 2005298875 A | 10/2005 | | |
| JP | 2007149847 | * 6/2007 | ............ | H01F 1/34 |
| KR | 100611613 B1 | 8/2006 | | |

OTHER PUBLICATIONS

Chinese Office Action dated Nov. 26, 2012 (and English translation thereof) in counterpart Chinese Application No. 200980144535.3.
Material Property Database (http://www.mit.edu/~6.777/matprops/polymide.htm).
K. Kondo et al; NEC Tonkin Technical Review; vol. 31, pp. 92-96; 2004.
International Search Report dated Sep. 15, 2009 issued in International Application No. PCT/JP2009/003591.
Korean Office Action dated Apr. 20, 2015 issued in counterpart Korean Application No. 10-2011-7009843.

* cited by examiner

[ FIG. 1 ]
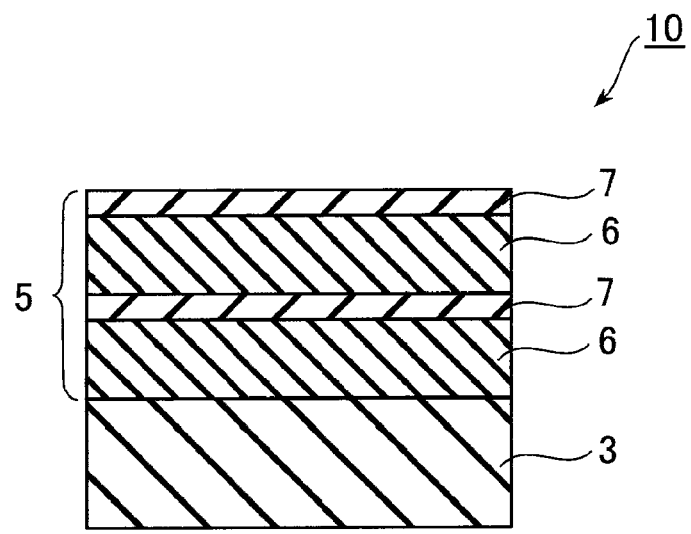
[ FIG. 2 ]
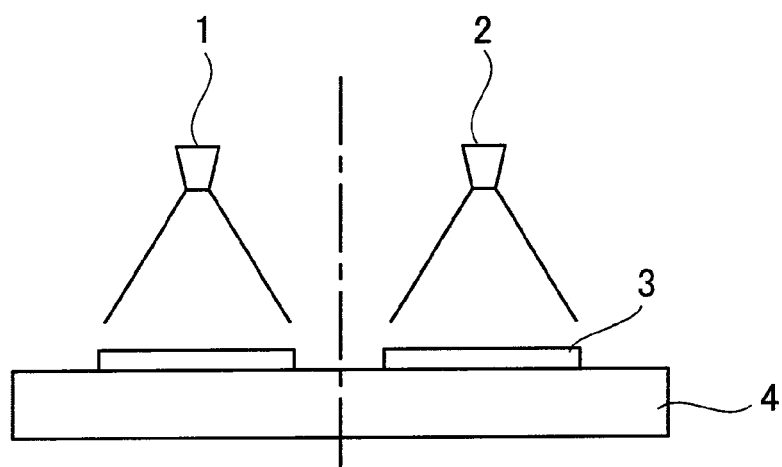

[ FIG. 3 ]
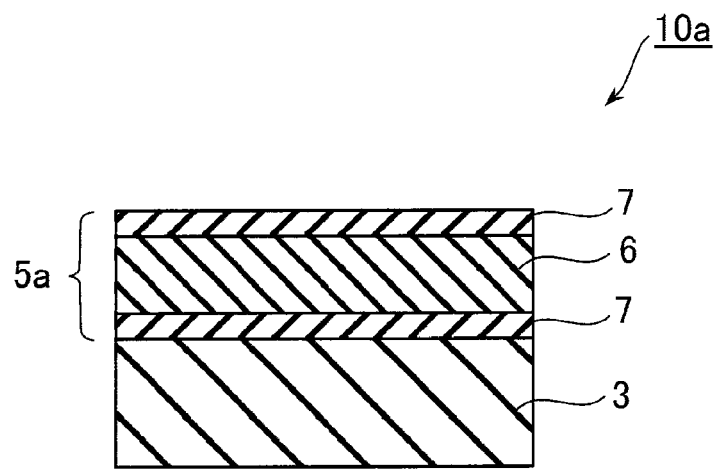
[ FIG. 4 ]
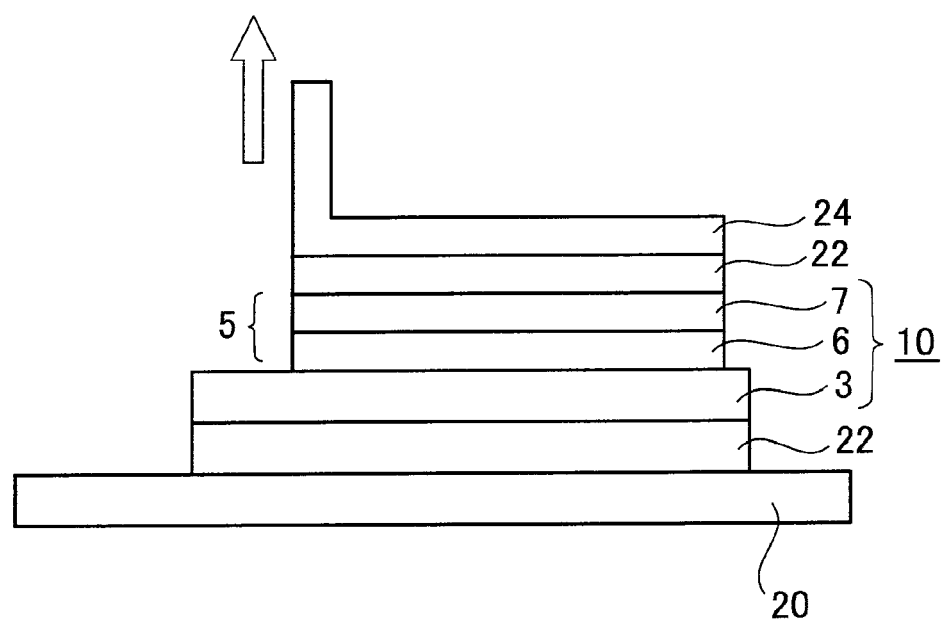

[ FIG. 5 ]
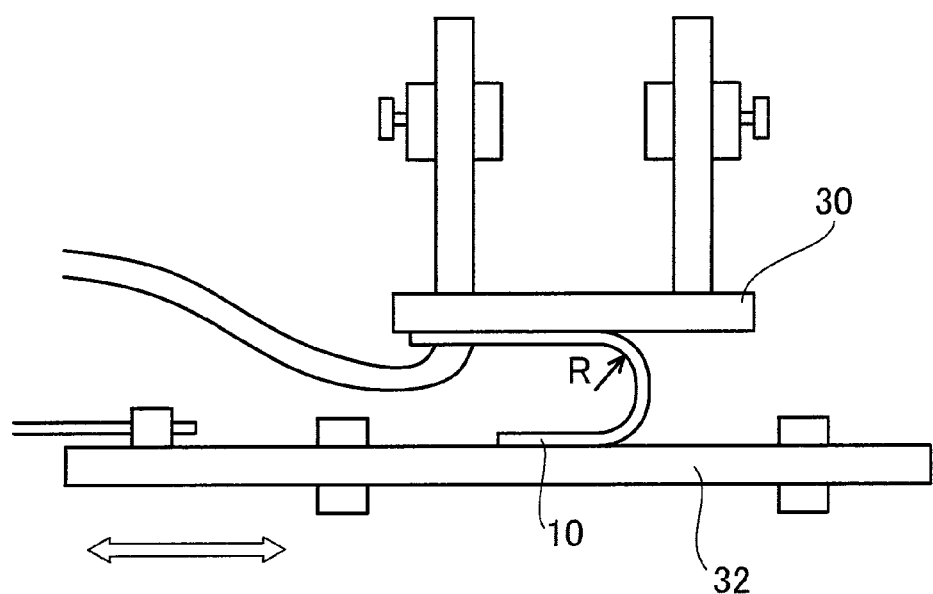

BODY WITH MAGNETIC FILM ATTACHED AND MANUFACTURING METHOD THEREOF

This application is a Divisional application of U.S. Ser. No. 13/128,759, which is a U.S. National Phase Application under 35 USC 371 of International Application PCT/JP2009/003591 filed Jul. 29, 2009, which is also based upon and claims the benefit of priority from prior Japanese Patent Application No. 2008-289493, filed Nov. 12, 2008, the entire contents of both of which are incorporated herein by reference.

TECHNICAL FIELD

This invention relates to a magnetic film provided body and a fabrication method thereof, wherein the magnetic film provided body is formed of a base body provided with a magnetic film, especially, a spinel-structured ferrite film.

BACKGROUND ART

A ferrite plating method provides a fine quality ferrite film and is, for example, disclosed in Patent Document 1. The ferrite plating method comprises the steps of: preparing a specific solution containing at least ferrous ions; bringing a surface of a base body into contact with the specific solution to cause $Fe^{2+}$ ions, or $Fe^{2+}$ ions and other metal hydroxide ions, to be absorbed on the surface of the base body; and oxidizing the absorbed $Fe^{2+}$ ions to obtain $Fe^{3+}$ ions to cause the $Fe^{3+}$ ions and metal hydroxide ions in the specific solution to undergo a ferrite crystallization reaction so that a ferrite film is formed on the surface of the base body.

The above-described ferrite plating method allows use of any kinds of base bodies, provided that the base bodies have tolerance to the solution. The ferrite plating method can produce a spinel-structured ferrite film under a relatively low temperature (the normal temperature to the boiling point of the solution or lower) because it is based on the reaction by using the solution. The ferrite plating method is superior to other ferrite film formation techniques in fewer limitations for the base body. The ferrite film formed through the ferrite plating method is superior in that the ferrite film, which is of ceramics, has flexibility and is easy to handle.

There are provided Patent Document 2 to Patent Document 6 and Non-Patent Document 1 as documents concerning the ferrite plating method. Patent Document 2 discloses a technique which homogenizes ferrite films formed and increases reaction rate in a ferrite film formation process. Patent Document 3 discloses a technique which makes a surface of a base body denatured and active by plasma processing so that ferrite films can be formed on the various base bodies. Patent Document 4 discloses a technique which relates to increasing ferrite film formation rate. Patent Document 5 discloses a technique which improves an insulation property of a ferrite film or a support body by coating the ferrite film or the support body with an insulation material. Patent Document 6 discloses a technique which relates to a ferrite thin film having high magnetic permeability over a wide frequency range. Patent Document 7 discloses a technique of forming a magnetic film (a ferrite film) by laminating strain-relaxation chemical compound layers and ferrite-constituent atom layers. Non-Patent Document 1 discloses a technique which relates to a noise-suppressor using the ferrite thin film based on the technique of Patent Document 6.

Patent Document 1: JPA S59-111929
Patent Document 2: JPA S60-140713
Patent Document 3: JPA S61-030674
Patent Document 4: JPA H02-166311
Patent Document 5: JPA 2005-298875
Patent Document 6: JPA 2005-191098
Patent Document 7: JPA H1-122929
Non-Patent Document 1: "GHz Conducted Noise Suppression Effects by Ferrite Thin Films Plated onto Polyimide Sheet", NEC TOKIN Technical Review vol. 31, p. 92, 2004; Koichi Kondo, Tatsuya Chiba, Hiroshi Ono, Shigeyoshi Yoshida and Masanori Abe

DISCLOSURE OF INVENTION

Problems to be Solved by Invention

According to Patent Document 7, an exfoliation would not occur even when a thickness of the magnetic film is more than two micro meters. However, depending on the forming conditions, the magnetic film would be exfoliated from a base body or the magnetic film itself would be damaged in a case where the thickness is more than two micro meters It is therefore an object of the present invention to determine an optimum forming condition of providing a magnetic film on a base body and to provide a fabrication method of a magnetic film provided body in which no exfoliation occurs even when a thickness of the magnetic film is more than two micro meters.

In addition, it is another object of the present invention to provide a magnetic film provided body which is fabricated in accordance with the above-mentioned fabrication method thereof.

Means for Solving the Problems

One aspect of the present invention provides a fabrication method of a magnetic film provided body comprising preparing a base body and forming a magnetic film on the base body. The magnetic film comprises organic film(s) and ferrite film(s) alternately layered. The formation of the magnetic film alternately carries out: forming a ferrite film through a ferrite plating method, the ferrite film having a thickness of 20 μm or less; and forming an organic film, the organic film having a thickness of 0.1 μm to 20 μm, both inclusive. The organic film has a ratio t/E of 0.025 μm/GPa or more, where "t" indicates the thickness of the organic film, and "E" indicates Young's modulus of the organic film.

Another aspect of the present invention provides a magnetic film provided body comprising a base body and a magnetic film provided on the base body. The magnetic film comprises organic film(s) and ferrite film(s) alternately layered and an adhesive strength between the organic film and the ferrite film is 0.1 kN/m or more.

Advantageous Effect of Invention

According to the present invention, by determining an optimum condition, a magnetic film which has a high adhesive strength can be formed on a base body, wherein the magnetic film comprises an organic film(s) and a ferrite film(s).

BRIEF DESCRIPTION OF DRAWINGS

FIG. 1 is a cross-sectional view schematically showing a magnetic film provided body according to an embodiment of the present invention.

FIG. 2 is a view schematically showing a film formation apparatus which is used in a fabrication method of the magnetic provided body according to an embodiment of the present invention.

FIG. 3 is a cross-sectional view schematically showing a variation example of the magnetic film provided body of FIG. 1.

FIG. 4 is a view schematically showing an examination method of adhesive strength.

FIG. 5 is a view schematically showing an examination method of flexibility.

DESCRIPTION OF NUMERALS

1 Reaction Solution Nozzle
2 Oxidizing Solution Nozzle
3 Base body
4 Turn Table
5, 5a Magnetic Film
6 Organic Film
7 Ferrite Film
10, 10a Magnetic Film Provided Body
20 Stage
22 Double-sided Tape
24 PET Film
30 Mount Plate
32 Vibration Plate
R Bending Radius

BEST MODE FOR CARRYING OUT INVENTION

As shown in FIG. 1, a magnetic film provided body 10 according to an embodiment of the present invention comprises a base body 3 and a magnetic film 5 provided on the base body 3. The magnetic film 3 comprises organic films 6 and ferrite films 7 alternately layered. An adhesive strength between the organic film 6 and the ferrite film 7 is 0.1 kN/m or more. Especially, in the magnetic film provided body 10 of the present embodiment, it is not the ferrite film 7 but the organic film 6 which is formed directly on the base body 3. An adhesive strength between the directly-formed organic film 6 and the base body 3 is 0.1 kN/m or more, too. In the present embodiment, the adhesive strength between the base body 3 and the organic film 6 as well as each adhesive strength between the organic film 6 and the ferrite film 7 is 0.1 kN/m or more so that an exfoliation problem may not occur. The adhesive strength in the embodiment is examined by the exfoliation test in conformance with JIS C5016 (test methods for flexible printed wiring boards).

In order that the adhesive strength between the layers to be 0.1 kN/m or more, in the embodiment, optimum conditions of a thickness of the ferrite film, a thickness of the organic film, and a ratio t/E are defined as follows, where "t" indicates the thickness of the organic film 6, and "E" indicates Young's modulus of the organic film 6. First, the ratio of t/E of each organic film 6 is defined to be 0.025 μm/GPa or more. By the use of the organic film 6 which satisfies the condition, a sufficient stress relaxation effect can be obtained. In addition, the thickness of each ferrite film 7 is defined to be 20 μm or less, and the organic film 6 which has a thickness of 0.1 μm or more is interposed between the ferrite films 7. Therefore, the above-mentioned adhesive strength of 0.1 kN/m or more can be obtained. In consideration of productivity, the ratio of t/E is preferred to be 1000 μm/GPa or less. A total thickness of the ferrite films 7 included in the magnetic film 5 is defined to be 1 μm or more so that the magnetic film 5 which produces a high electromagnetic effect can be obtained. The thickness of each organic film 6 is defined to be 20 μm or less so that a device which uses the magnetic film provided body of the embodiment can be miniaturized.

There is no limitation for a material of the base body 3, provided that the material has tolerance to the solution. For example, the material of the base body 3 may be selected from a group consisting of: various kinds of plastics such as polyimide sheet, polyethylene terephthalate and so on; various kinds of metals such as copper, nickel, silver, gold, tungsten, molybdenum, platinum, palladium, iron, iron alloy and so on; various kinds of organic layered sheets, in other words, various kinds of layered sheets such as paper epoxy, glass epoxy, grass polyester and so on; various kinds of glass; ceramics; and so on.

In the embodiment, a purpose of using the organic film 6 is not to insulate between the ferrite films 7 nor between the ferrite film 7 and an external member. As for a material of the organic film 6, a material having any specific electrical resistance may be used. For example, the organic film 6 may be made of resin selected from a group consisting of phenol resin, epoxy resin, melamine resin, urea resin, unsaturated polyester resin, polyimide, polyethylene, polypropylene, polyvinyl chloride, polyvinylidene chloride, polystyrene, polyvinyl acetate, ABS resin, acrylic resin, polyamide, nylon, polyacetal, polycarbonate, polybutylene terephthalate, polyethylene terephthalate, polyphenylene sulfide, polysulfone, polyethersulfone, polyarylate, polymer liquid crystal, polyamide-imide and one of these resin including metal powder. The organic film 6 may be made of resin which includes magnetic powder. For example, a material of the magnetic powder may be selected from a group consisting of ferrite, Fe. Fe—Co alloy, Fe—Si alloy, Fe system alloy such as Fe—Si—Al, Ni system alloy such as Ni—Fe alloy and so on. Furthermore, the organic film 6 may be a high dielectric constant material made of resin which includes carbon or metal powder.

In the embodiment, there is no limitation to a film formation method of the organic film 6. For example, the organic film 6 may be formed by applying a resin which has moderate fluidity by an applying apparatus such as a spin coater, or the organic film 6 may be formed by a film formation apparatus such as sputtering and so on.

In the embodiment, the ferrite film(s) 7 is formed through the ferrite plating method. A film formation apparatus, for example as shown in FIG. 2, may be used for forming a ferrite plate. The illustrated film formation apparatus is an apparatus for forming a ferrite film on the base body 3 and comprises a reaction solution nozzle 1, an oxidizing solution nozzle 2 and a turn table 4. The turn table 4 is a table turnable around its axis. The base body 3 moves in response to the turning of the turn table 4. The reaction solution nozzle 1 is configured to supply a reaction solution for the turn table 4, wherein the reaction solution contains at least ferrous ions/$Fe^{2+}$ ions). The reaction solution nozzle 1 is fixed above the turn table 4. The oxidizing solution nozzle 2 is configured to supply an oxidizing solution for the turn table 4, wherein the oxidizing solution contains at least an oxidizing agent. The oxidizing solution nozzle 2 is fixed above the turn table 4. In the illustrated film formation apparatus, the reaction solution nozzle 1 is positioned above one of half regions of the turn table 4 stopped, while the oxidizing solution nozzle 2 is positioned above the other half region of the turn table 4 stopped. When the turn table 4 is turned with the reaction solution and the oxidizing solution respectively supplied from the reaction solution nozzle 1 and the oxidizing solution nozzle 2, the reaction solution and the oxidizing solution are alternately supplied for the base body 3, and excess reaction solution and oxidizing solution are removed by centrifugal force. As a result, the ferrite film based on the ferrite plating method is formed on the base body 3. Compositions of the ferrite films 7 may be different from each other.

In the embodiment, it is not the ferrite film 7 which is formed directly on the base body 3. However, for example, a magnetic film provided body 10a may comprise a magnetic film 5a formed by forming the ferrite film 7 directly on the base body 3, as shown in FIG. 3. In this case, the base body 3 may be made of an organic material. Similarly to the organic film 6, the organic material in this case is preferred to have a ratio t/E of 0.025 μm/GPa or more. In this manner, the adhesive strength between the base body 3 made of the organic material and the organic film 7 directly formed thereon can be 0.1 kN/m or more. Furthermore, it is preferable to maintain a ratio of t/E of the organic material of the base body 3 to be 1000 μ/GPa or less.

For a property examination of the magnetic film provided body, various magnetic film provided bodies were formed, as listed in the following table. In the table, each of concrete examples 1~5 is a magnetic film provided body which satisfies a condition according to the present embodiment, while each of comparative examples 1~5 is a magnetic film provided body which does not satisfy the condition according to the present embodiment.

TABLE 1

| | Concrete Example 1 | | Concrete Example 2 | | Concrete Example 3 | | Concrete Example 4 | | Concrete Example 5 | | Comparative Example 1 | | Comparative Example 2 | | Comparative Example 3 | | Comparative Example 4 | |
|---|---|---|---|---|---|---|---|---|---|---|---|---|---|---|---|---|---|---|
| Material and Thickness (μm) of 6th Layer | Ferrite | 2 | Ferrite | 1 | | | | | | | | | | | | | | |
| Material and Thickness (μm) of 5th Layer | Polyimide B | 1 | Polyimide A | 0.1 | | | | | | | | | | | | | | |
| Material and Thickness (μm) of 4th Layer | Ferrite | 2 | Ferrite | 1 | Ferrite | 0.5 | | | | | | | | | | | | |
| Material and Thickness (μm) of 3rd Layer | Polyimide B | 1 | Polyimide A | 0.1 | Polyimide B | 20 | Ferrite | 3 | Ferrite | 3 | | | | | | | | |
| Material and Thickness (μm) of 2nd Layer | Ferrite | 2 | Ferrite | 1 | Ferrite | 0.5 | Polyimide A | 6 | Epoxy + Fe | 20 | Ferrite | 25 | | | Ferrite | 18 | | |
| Material and Thickness (μm) of 1st Layer | Polyimide B | 1 | Polyimide A | 0.1 | Polyimide B | 20 | Ferrite | 3 | Ferrite | 3 | Polyimide A | 2 | Ferrite | 5 | Polyimide A | 0.05 | Ferrite | 6 |
| Material and Thickness (μm) of Base Body | Glass | 1000 | Glass | 1000 | Glass | 1000 | Polyimide | 25 | Polyimide | 25 | Glass | 1000 | Glass | 1000 | Glass | 1000 | Polyimide | 25 |
| Total Thickness (μm) of the Ferrite Film | 6 | | 3 | | 1 | | 6 | | 6 | | 25 | | 5 | | 18 | | 6 | |
| Position of the Existence of Exfoliation | between PET and Double-sided tape | | between PET and Double-sided tape | | between PET and Double-sided tape | | between PET and Double-sided tape | | between PET and Double-sided tape | | between 1st layer and 2nd layer | | between Base Body and 1st layer | | between Base Body and 1st layer | | between Base Body and 1st layer | |
| Adhesive Strength between the Layers | >2.0 | | >2.0 | | >2.0 | | >2.0 | | >2.0 | | 0.05 | | Exfoliation Occurs before | | 0.09 | | 1 | |

TABLE 1-continued

| | Concrete Example 1 | Concrete Example 2 | Concrete Example 3 | Concrete Example 4 | Concrete Example 5 | Comparative Example 1 | Comparative Example 2 | Comparative Example 3 | Comparative Example 4 |
|---|---|---|---|---|---|---|---|---|---|
| (kN/m) | | | | | | the Test | | | |
| Young's Modulus E GPa) of the Organic Film | 3 | 4 | 3 | 4 | 4 | 4 | — | 4 | — |
| Film Thickness t(μm) of the Organic Film | 1 | 0.1 | 20 | 6 | 20 | 2 | — | 4 | — |
| t/E (μm/GPa) | 0.33 | 0.025 | 6.67 | 1.5 | 5 | 0.5 | — | 0.01 | — |
| Occurrence of the Exfoliation after Bending Test (100,000 times) | — | — | — | No Exfoliation | No Exfoliation | — | — | — | Exfoliation Occurs |

Hereinafter, a supplemental explanation will be made about a size and a fabrication condition of each of the examples listed in the table.

A size of the base body 3 made of the glass substrate is 50 mm×50 mm×1 mm. A size of the base body 3 made of the polyimide sheet is 50 mm×50 mm×25 mm. The former corresponds to the concrete example 1~3 and the comparative example 1~3. The latter corresponds to the concrete example 4 and and the comparative example 4.

In the above-mentioned examples of the organic films 6, "Polyimide A" is a polyimide film which has relatively high Young's modulus (Young's modulus of 4 GPa), and "Polyimide B" is a polyimide film which has relatively low Young's modulus (Young's modulus of 3 GPa). An explanation will be made for a forming method of the polyimide film with taking an example where the polyimide film is formed on a glass substrate. First, a dilute agent was added into and mixed with polyamic acid of a precursor of polyimide. Secondly, the aforementioned mixture was applied on a surface of the glass substrate by a spin coater. An application thickness was adjusted by viscosity of a solution, the number of revolutions of the spin coater, and so on. After that, the glass substrate applied with the solution was heated at 90° C. for 5 minutes, followed by heated at 320° C. for 60 minutes. Thus, the polyimide film was formed on the glass substrate. By adjusting the formation conditions, the organic films 6 can be obtained wherein the organic films 6 is made of the polyimide A of high Young's modulus (4 GPa) or the polyimide B of low Young's modulus (4 GPa).

The organic film 6 of the concrete example 5 is a mixture of epoxy resin and Fe. As for the organic film 6. Fe particle was mixed into pre-polymer of epoxy resin, wherein Fe particle has an average particle diameter of 3 μm and the Fe content was 45 vol %, and thereafter a curing agent was mixed. Next, the mixture was applied so that an average thickness is 2 μm. Furthermore, the applied film was maintained at 100° C. for 6 hours and cured. A specific resistance of the mixture of epoxy resin and Fe formed in the above-described manner was 100 Ωcm.

The ferrite film 7 was formed as follows. As a pretreatment, a turn table 4 was turned after the base body 3 was disposed on the turn table 4, while deoxidized ion-exchange water was provided on the base body 3 under a heat treatment up to 90° C. Next, nitrogen gas was introduced into the film formation apparatus so that deoxide atmosphere was prepared in the apparatus. Then, the step of supplying the reaction solution for the base body 3 from the reaction solution nozzle 1 and the step of supplying the oxidizing solution for the base body 3 from the oxidizing solution nozzle 2 were carried out while the turn table 4 was turned. In other words, the step of supplying the reaction solution and the step of supplying the oxidizing solution were carried out alternately and repeatedly. Here, flow rate upon the supply of each of the reaction solution and the oxidizing solution was set to 40 ml/min. The reaction solution was prepared by dissolving $FeCl_2\text{-}4H_2O$, $NiCl_2\text{-}6H_2O$ and $ZnCl_2$ into deoxidized ion-exchange water. The oxidizing solution was prepared by dissolving $NaNO_2$ and $CH_3COONH_4$ into deoxidized ion-exchange water. The reaction solution and the oxidizing solution may be formed with reference to, for example, U.S. 2009-0047507A1, U.S. 2007-0231614A1, or other materials. Here, the explanation was made with taking an example where the ferrite film 7 was formed on the base body 3. Similar method was carried out for a case where the ferrite film 7 was formed on the organic film 6.

Chemical composition of each ferrite film of the concrete example 1~5 and the comparative example 1~4 as listed on the table was examined by an inductively coupled plasma spectroscopy (ICPS) method. As a result, each of the ferrite films has an average composition of $Ni_{0.2}Zn_{0.3}Fe_{2.5}O_4$. A scanning electron microscope (SEM) was used for a configuration analysis such as measurement of film thickness.

An examination of the adhesive strengths was carried out in conformance with JIS C5016 (test methods for flexible printed wiring boards). Peel strength was taken as the adhesive strength. In detail, as shown in FIG. 4, the obtained magnetic film provided body 10 was fixed on a stage 20 with a double-sided tape 22. A PET film 24 was stuck to the top layer of the ferrite film 7 by a double sided tape 22. In this state, the PET film was peeled off in the 90° direction. By recording a position of exfoliation occurred between the layers and the scale on a force gages at that time, the value of the scale was taken as the adhesive strength.

An examination of the flexibility was carried out in conformance with JIS C5016 (a test method for flexible printed wiring boards). In detail, as shown in FIG. 5, the obtained magnetic film provided body 10 was bent, where the bending radius R was 3 mm. End portions of the magnetic film provided body 10 was fixed to a mount plate 30 and a vibration plate 32, respectively. In this state, a bending test was carried out for the vibration plate 32 which was subjected to the reciprocating motion for a hundred-thousand times, where each stroke is 30 mm and each reciprocate cycle is twice per second. After the bending test of the reciprocating motion for 100 thousand times, a visual examination was carried out to check the occurrence of the exfoliation between any layers. When there was no exfoliation as a result of the examination, flexibility was judged to be fine. The bending test was carried out only for the magnetic film provided body of which the base body is polyimide, as the glass substrate cannot be bent. The results of the examinations are also listed on the aforementioned tables.

It is obvious from the tables that for the magnetic film provided bodies of the concrete examples 1~5, each adhesive strength between the organic film 6 and the ferrite film 7 is 0.1 kN/m or more because each organic film 6 has a thickness of 0.1 µm to 20 µm, both inclusive; each ferrite film(s) 7 has a thickness of 20 µm or less; and a ratio t/E is of 0.025 µm/GPa or more, where "t" indicates the thickness of the organic film, and "E" indicates Young's modulus of the organic film. Accordingly, no exfoliation occurs in the magnetic film provided body 10.

On the other hand, for the magnetic film provided bodies of comparative examples 1~3, each adhesive strength in the magnetic film provided bodies are 0.1 kN/m or less because the condition such as thickness of the organic films, Young's modulus and thickness of the ferrite are not satisfied. This results in occurrence of the exfoliation between any layers of the magnetic film provided body 10. In the comparative example 4, exfoliation occurred after the 100 thousand times of the bending test. This is caused by the single layered ferrite film 7 formed on the base body 3 made of the organic material.

INDUSTRIAL APPLICABILITY

A ferrite provided body according to the present invention can be used in an inductance element, an impedance element, a magnetic head, a microwave element, a magnetostriction element and a high-frequency magnetic device such as an electromagnetic interference suppressor. Especially, it is suitable in the case where the magnetic film including the ferrite film is required to be relatively thick. The electromagnetic interference suppressor is for suppressing electromagnetic problems caused by interferences of undesired electromagnetic waves in a high frequency region.

The invention claimed is:

1. A fabrication method of a magnetic film provided body comprising:
   preparing a base body; and
   forming a magnetic film on the base body, the magnetic film comprising a first ferrite film, an organic film, and a second ferrite film, with the organic film layered between the first and second ferrite films,
   wherein the formation of the magnetic film comprises:
      forming the first ferrite film through a ferrite plating method, the first ferrite film having a thickness of 20 µm or less;
      forming the organic film, the organic film having a thickness of 0.1 µm to 20 µm, and the organic film having a ratio t/E of 0.025 µm/GPa or more, where "t" indicates the thickness of the organic film, and "E" indicates Young's modulus of the organic film; and
      forming the second ferrite film through the ferrite plating method, the second ferrite film having a thickness of 20 µm or less.

2. The fabrication method as recited in claim 1, wherein the formation of the magnetic film further comprises:
   forming another organic film directly on the base body,
   wherein the first ferrite film is formed on said another organic film.

3. The fabrication method as recited in claim 1, wherein the formation of the magnetic film comprises forming the first ferrite film directly on the base body.

4. A fabrication method of a magnetic film provided body comprising:
   preparing a base body; and
   forming a magnetic film on the base body, the magnetic film comprising at least two organic films and at least two ferrite films alternately layered,
   wherein the formation of the magnetic film comprises:
      forming a first organic film directly on the base body;
      forming a first ferrite film through a ferrite plating method directly on the first organic film;
      forming a second organic film directly on the first ferrite film; and
      forming a second ferrite film through the ferrite plating method directly on the second organic film,
   wherein each of the first and second organic films has a thickness of 0.1 µm to 20 µm, and each of the first and second organic films has a ratio t/E of 0.025 µm/GPa or more, where "t" indicates the thickness of the organic film, and "E" indicates Young's modulus of the organic film, and
   wherein each of the first and second ferrite films has a thickness of 20 µm or less.

5. The fabrication method as recited in claim 4, wherein the first and second organic films are polyimide films.

6. The fabrication method as recited in claim 5, wherein the first and second organic films have a Young's modulus of 4 GPa.

7. The fabrication method as recited in claim 5, wherein the first and second organic films have a Young's modulus of 3 GPa.

8. A fabrication method of a magnetic film provided body comprising:
   preparing a base body; and
   forming a magnetic film on the base body, the magnetic film comprising an organic film and two ferrite films alternately layered, with the organic film between the two ferrite films,
   wherein the formation of the magnetic film comprises:
      forming a first ferrite film through a ferrite plating method directly on the base body;
      forming an organic film directly on the first ferrite film; and
      forming a second ferrite film through the ferrite plating method directly on the organic film,
   wherein the organic film has a thickness of 0.1 µm to 20 µm, both inclusive, and the organic film has a ratio t/E of 0.025 µm/GPa or more, where "t" indicates the thickness of the organic film, and "E" indicates Young's modulus of the organic film, and wherein each of the first and second ferrite films has a thickness of 20 μm or less.

9. The fabrication method as recited in claim 8, wherein the base body is made of an organic material.

10. The fabrication method as recited in claim 9, wherein the base body has a ratio t/E of 0.025 μm/GPa or more, where "t" indicates a thickness of the base body, and "E" indicates Young's modulus of the base body.

11. The fabrication method as recited in claim 8, wherein the organic film is a polyimide film.

12. The fabrication method as recited in claim 8, wherein the organic film comprises epoxy resin and Fe.

* * * * *